United States Patent
Sigmon

[15] 3,704,429

[45] Nov. 28, 1972

[54] NEGATIVE RESISTANCE DIODE COAXIAL CAVITY OSCILLATOR WITH RESISTOR FOR SUPPRESSING UNDESIRED MODES

[72] Inventor: Bernard E. Sigmon, Tampa, Fla.

[73] Assignee: Sperry Rand Corporation

[22] Filed: June 19, 1970

[21] Appl. No.: 49,439

[52] U.S. Cl. .......................331/101, 330/34, 330/56, 331/107 R, 331/107 G, 331/107 T, 331/177 V, 333/82 B

[51] Int. Cl. ..............................H03b 7/14, H03f 3/10

[58] Field of Search......331/96, 97, 101, 102, 107 R, 331/107 G, 107 T, 117 V, 117 D; 333/81 A, 82 B; 330/56, 34, 61 A

[56] References Cited

UNITED STATES PATENTS

| | | | |
|---|---|---|---|
| 3,599,118 | 8/1971 | Large | 331/96 |
| 3,605,034 | 9/1971 | Rucker | 331/107 R |
| 3,621,463 | 11/1971 | Olson, Jr. | 331/107 R X |
| 3,231,831 | 1/1966 | Hines | 331/96 |
| 3,533,017 | 10/1970 | Scherer | 331/107 |

*Primary Examiner*—Roy Lake
*Assistant Examiner*—Siegfried H. Grimm
*Attorney*—S. C. Yeaton

[57] ABSTRACT

A negative resistance diode device is coupled to oscillating high frequency fields within a coaxial line cavity resonator for amplifying those electromagnetic fields. The combination forms a single port, high frequency amplifier or oscillator. A resistive device is coupled within the inner conductor of the coaxial resonator for supplying bias to the negative resistance diode device, for eliminating spurious modes of high frequency oscillation in the resonator, and for facilitating electronic tuning of the operating high frequency of the converter.

4 Claims, 1 Drawing Figure

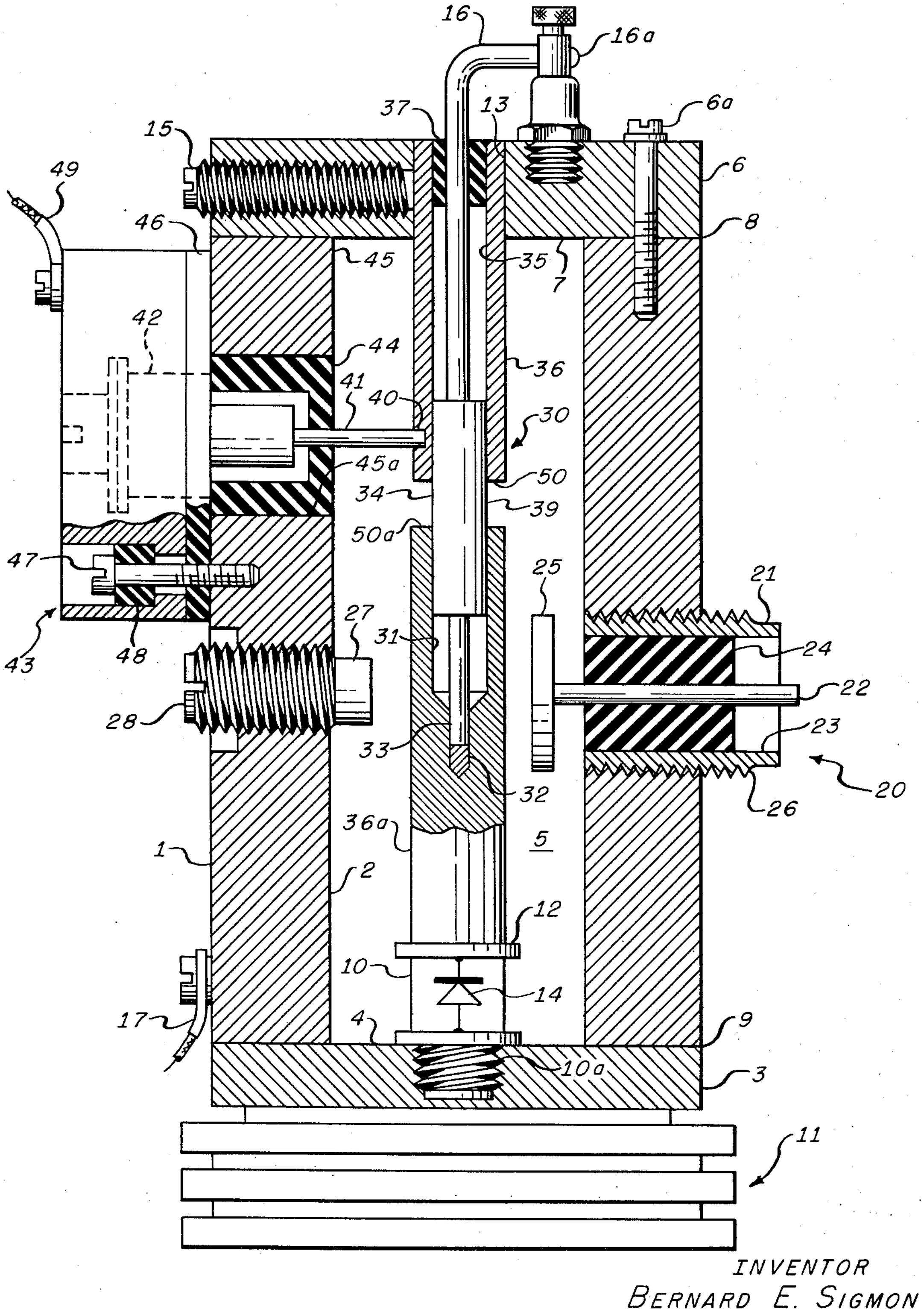
INVENTOR
BERNARD E. SIGMON
BY
HP Terry
ATTORNEY

NEGATIVE RESISTANCE DIODE COAXIAL CAVITY OSCILLATOR WITH RESISTOR FOR SUPPRESSING UNDESIRED MODES

The invention herein described was made in the course of or under a contract or subcontract thereunder with the United States Air Force

BACKGROUND OF THE INVENTION

1. Field of the Invention

The invention pertains to means for the generation or amplification of desired high frequency oscillations within electronically tunable hollow resonators and more particularly to the efficient generation or amplification of such desired high frequency signals without generation of spurious signals, all by the use of active semiconductor elements exhibiting negative resistance characteristics.

2. Description of the Prior Art

High frequency energy converters employing active semiconductor devices for amplification of high frequency fields within cavity resonators are known in the art. It has not generally been possible, however, to devise designs for such devices that are fully free of spurious modes of operation and which may readily be tuned electronically in a predictable and repeatable manner over a considerably band of frequencies. The active semiconductor device itself may often be a seat of serious instability.

A further problem with the use of many types of cavity resonators in such prior art oscillators and amplifier systems is that oscillation modes having frequency harmonic relation may be excited, since such resonators usually display a relatively high quality factor Q over an extended frequency band. Because any undesired mode requires power to be sustained, it absorbs power which, in the absence of the mode, would be applied usefully in excitation of the mode of desired frequency. Further, the undesired signals may appear at various and time-varying levels in the output of the device. Similarly, space harmonic modes within the cavity may undesirably waste power and modify the desired output signal. Not only is the presence in the output of such undesired signals a serious problem in itself, but undesired interactions may often be present between the desired signal and the spurious signals as well as between undesired signals.

Control over undesired mode excitation has been exercised in the past by the use of relatively delicate microwave resistance films plated or otherwise applied on portions of the resonator cavity walls, by the use of one or more coupling orifices oriented to couple undesired mode energy out of the resonant cavity, or by construction of specially shaped cavity resonators, some having within their interiors complex vanes or other such elements to discriminate against undesired oscillation modes.

Electronic tuning of cavity resonator oscillators has been achieved in the past using certain semiconductor diodes of the type behaving as variable capacitors upon variation of a biasing electric field placed across them. For tuning such resonators, variable capacity diodes are often coupled to the oscillating high frequency field within the cavity resonator by a coupling loop. Awkward restrictions limit the utility and stability of such coupling arrangements; both the active diode and the tuning diode require individual and non-interacting biasing circuits within the interior of the resonator. If the tuner loop is completely electrically isolated from the resonator, it is difficult to adjust in position and there may be undesirable high frequency energy loss because of the use of isolating dielectric material in association with elements of the tuner system. On the other hand, if one side of the tuner diode circuit is connected directly to the resonator circuit, the tuner diode may be above ground potential at both of its terminals and is vulnerable to accidental burn out on that account.

These several problems have made it difficult, in the past, to provide high frequency semiconductor diode amplifiers and oscillators having desirable tunability and reliable operation characteristics over an appreciable frequency band.

SUMMARY OF THE INVENTION

The present invention concerns an active negative-resistance semiconductor diode energy converting circuit which operates efficiently as an oscillator or amplifier of high frequency or microwave energy. The improved energy converting device includes a hollow cavity resonator of the coaxial line type within which is coupled a self-resonant diode biased by an external biasing means so as to exhibit its negative resistance characteristic. The diode is located in the inner conductor circuit of the coaxial line resonator. A resistance device also located within the inner conductor is arranged both to supply a suitable bias voltage to the active diode and to eliminate spurious oscillations because of its particular location relative to desired and undesired oscillating electric fields within the cavity resonator. The inventive configuration also cooperates in permitting one side of a variable capacitor tuning diode to be directly connected to the inner conductor of the coaxial resonator at ground potential. As a consequence, the tuning diode may be operated with greatly reduced risk of accidental burn out and radiation leakage is eliminated.

The invention avoids the need for complex dissipative circuit elements inside of or outside of the resonant cavity, complex electrically insulated cavity portions, microwave chokes in association with such isolated portions, and prior art configurations that are difficult to manufacture and to maintain and are cumbersome, expensive, and heavy. While applicable to use in high frequency amplifiers and oscillators designed to operate over selected parts of a wide range of high frequencies, the invention is particularly advantageous for use in the higher frequency microwave ranges, including the so-called X-band and other higher frequency bands. In such frequency regimes, the resonant cavities are so small that the elements associated with them become correspondingly very small. The essential elements become fragile and difficult to assemble. Provision of means such as present in the prior art for biasing, for electronic tuning, and for suppressing undesired oscillation modes and other noise energy becomes increasingly difficult.

BRIEF DESCRIPTION OF THE DRAWING

The single FIGURE is an elevation view, partly in cross section, of a preferred embodiment of the invention.

DESCRIPTION OF THE PREFERRED EMBODIMENT

The sole FIGURE illustrates a preferred form of the microwave energy converter; the embodiment is in the form of a hollow coaxial line cavity resonator semiconductor-diode oscillator or amplifier. In the FIGURE, cavity resonator 5 is bounded by a cylindrical tubular wall 1 made of material of good conductivity for high frequency currents and having a circularly cylindric interior surface 2 thus also presenting good electrical conductivity characteristics at the operating high frequency. One end of cavity 5 is closed by a flat wall 3; though wall 3 may be formed integrally with wall 1, it is shown as a discrete part soldered to wall 1 at surface 9 and has adjacent the interior of cavity 5 a surface 4 also of good high frequency electrical conductivity.

Opposite wall 3, cavity 5 is further defined by a flat wall or plate 6, whose interior surface 7 also has good electrical conductivity, especially wherever adjacent cavity 5. Wall or plate 6 is not formed integrally with cylindrical wall 1, but is also a physically discrete part. Walls or plates 3 and 6 are respectively fastened to the cylindrical wall 1 during assembly of the apparatus by any known fastening method, such as by the use of machine screws such as screw **6*a*** or by soldering.

Integral with the exterior of wall 3 may be found a conventional device for exchange of heat with the surrounding medium, such as the flanged heat sink indicated at 11. Heat sink 11 serves to prevent undue rise of the temperature of the cavity resonator structure caused by bias power dissipation in the active junction of diode 10.

Surface 4 of wall 3 of cavity resonator 5 is connected to the opposed surface 7 of wall 6 by further elements of the invention, including active semiconductor or diode element 10 and a composite inner high frequency current conductor 30. The cylindrical surfaces of parts 36 and **36*a* of conductor 30 have low ohmic loss characteristics at the operating high frequency, similar to those of wall surfaces 2, 4, and 7**.

Semiconductor diode 10 is a commercially available microwave diode, for example, of the avalanche transit time type, although microwave diodes operating according to other energy converting mechanisms may be substituted, such as Gunn or tunnel diodes. Diode 10 is shown in full view and, for ease in understanding its relation to its associated elements, a schematic indication 14 of its polarization is illustrated as if it were actually printed on the cylindrical outer surface of diode 10. The function of diode 10 and its relation to composite inner conductor 30 remains to be discussed in greater detail.

For the purpose of abstracting high frequency energy from cavity 5, an output transmission line 20 may be provided. Line 20 may be, for example, a coaxial transmission line, having the usual inner conductor 22 and a tubular outer conductor 21. As is normal practice, inner conductor 22 is conveniently supported in concentric relation within outer conductor 21 by an apertured bead 24 of dielectric material having very low electrical loss characteristics at the operating frequency. The outer surface of outer conductor 21 is provided with threads 26 whereby it is fastened within a threaded hole passing through wall 1. Threads 26 also provide a convenient means for coupling an external transmission line (not shown) between the energy converter output and utilization apparatus. It will be evident to those skilled in the art that the single port energy converter may be used as an amplifier in the conventional manner by attaching a three port circulator device to transmission line 20.

Outer conductor 21 and bead 24 may end at surface 2 of wall 1 with a flat surface or a rounded end surface conforming to the shape of cylindrical surface 2. However, inner conductor 22 extends into cavity 5 for the purpose of supporting a round capacitive coupling disk or plate 25 within a cavity 5 adjacent composite inner conductor 30. Inner conductor 22 and thus capacitive disk 25 are located in a plane of high oscillating electric field strength within resonator 5. Alternatively, other known coupling means for extracting energy from the oscillating high frequency field in cavity 5 may be employed. A capacitive tuner element 28 is located in wall 1 directly opposite disk or plate 25 and is also centered substantially in the plane of the center of disk 25.

Tuner element 28 is a simple screw made preferably of the same good electrically conducting material as surfaces 2 and 4, for example. It is mounted in a threaded hole in wall 1 with its central axis substantially in the plane of the center of disk 25. Its inner face 27 is thus adjacent composite inner conductor 30, where it interacts in substantially a conventional manner with the oscillating electric fields in the vicinity of conductor 30 to provide the desired tuning effect. Coarse frequency adjustment is accomplished by simple rotation of screw 28 which translates face 27 relative to wall 2 and relative to composite conductor 30. Other known tuning mechanisms may be substituted for tuner screw 28, or it may be omitted.

As noted previously, a composite inner conductor 30 spans the cavity resonator 5 at its axis of symmetry; it consists of the active diode 10, a high frequency conductive rod 36a, a cylindrical resistor element 34, and a high frequency conductive tube 36 all in series relation. It will be seen that the parts of composite inner conductor 30 are arranged in such a manner that composite conductor 30 performs several important functions compatibly.

The active diode 10 may be conductively sealed at the center of surface 4 and may be, in turn, similarly conductively sealed at junction 12 to high frequency conductive rod 36a. These seals may be made by low temperature soldering or by the use of certain conductive cements readily available on the market. On the other hand, diode 10 may be provided with threaded parts which mate with threaded holes in surface 4, as at **10*a*, and in rod 36*a***.

At the face 50a or end of rod **36*a* remote from diode 10, there is supplied an axial bore 31 somewhat smaller in diameter than the outer diameter of rod 36*a*. The inner end of the bore 31 is supplied with a relatively smaller diameter axial bore 32. Resistor 34 is a commonly available resistor having a thin insulating cylindrical surface and of diameter substantially equal to that of bore 31. A first lead 33 of resistor 34 is inserted in the small bore 32 and is soldered or otherwise conductively fastened therein so as to expose above rod 36*a* a limited portion of the cylindrical surface 39 of resistor 34 to the high frequency fields found within cavity resonator 5**.

Tube 36 is also equipped with a bore 35 of diameter such that its face 50 is readily slipped over a portion of the cylindrical surface of resistor 34. A second electrical lead 16 of resistor 34 is brought entirely out of the cavity system through a hole in the insulating bead 37. Tube 36 fits in a bore 13 in end wall 6 and may be held fixed in relation to end surface 7 by a set screw 15 passing through a radial threaded hole in end wall 6 or by soldering. On the other hand, tube 36 may be integral with end wall 6.

One role of the composite inner conductor 30 is to supply an appropriate bias voltage to active diode 10 via resistor 34 from an external source (not shown) attached to insulated terminal 16*a* and thus to lead 16 and to terminal 17. Resistor 34 is a standard carbon resistor of the type commonly employed in relatively low frequency lumped constant circuits. It is not necessary to modify the resistor element; it may be simply employed directly as supplied by the manufacturer. The resistor 34 may nominally have a ⅛ or ¼ watt dissipation characteristic; its resistance value is experimentally determined according to the particular operating frequency and the type of diode 10. A safe minimum resistance value is selected to avoid excessive internal heating of the structure, since bias current for diode 10 must flow through resistor 34. A 50 ohm resistor has been used in certain forms of the invention.

A second significant function of the composite inner conductor 30 lies in substantially limiting the number of possible oscillating field modes within cavity 5 to a single desired field mode pattern. The cylindrical surface 39 of resistor 34 exposed between the respective faces 50 and 50*a* of tube 36 and rod 36*a* beneficially performs such a function. Experimental evidence suggests that the operation of resistor 34 in removing undesired signals from the oscillator output is to absorb energy in undesired modes to the extent that oscillations in such modes are substantially never sustained. At the desired operating frequency, no high frequency currents flow to and from the exposed surface of tube 36 across surface 39 of resistor 34 to and from the exposed surface of rod 36*a*. Thus, the exposed resistive surface 39 carries no high frequency current corresponding to the desired frequency. Experiencing no losses, the desired frequency signal strength grows, being efficiently amplified by the amplification mechanism of diode 10.

Signals having undesired space or frequency modes of oscillation cannot build up in amplitude, since each such mode would cause currents to flow along face 39 of resistor 34. Such modes would cause currents to penetrate into face 39 to the usual skin depth, whereby the undesired energy would be converted into heat. The important result is that the simple resistor 34 is involved within a microwave cavity resonator circuit in such a way as to suppress undesired modes without having any substantial effect on the efficient production of stable desired oscillations. A further significant feature lies in the fact that the subject undesired mode suppressing means can be incorporated directly within a portion of the microwave circuit in such a manner as to be effectively compatible therewith; i.e., the novel microwave circuit has natural geometrical and other characteristics permitting the direct incorporation of a simple resistor for suppressing undesired modes and preventing unstable and inefficient operation, while simultaneously supplying bias current to diode 10. An ancillary but important role of composite conductor 30 is to conduct heat produced by ohmic losses caused by bias current flow, as well as heat generated by undesired mode absorption, directly to the external surfaces of cavity resonator 5.

The composite center conductor 30 has a third significant function; e.g., it permits the incorporation of a trouble-free stable, electrically variable, capacitor tuning mechanism in the cavity resonator 5. The invention employs a variable capacity semiconductor or varactor diode 42 for this purpose, shown supported in a commercially available varactor diode mount 43. Diode mount 43 consists of a seat 44 of dielectric material affixed by cementing or other well known means in a hole 45*a* in resonator wall 45. Diode 42 is thereby insulated from wall 45.

Varactor diode 42 is further insulated from wall 45 by a mica or other insulator sheet 46 held against the outer surface of wall 45 by diode mount 43. Mount 43 is made of electrically conductive material and is fastened to wall 45 by screws, such as screw 47. Such screws are insulated from mount 43 and are threaded into the exterior surface of wall 45. Suitable clearance holes are furnished and provided, for instance, with a dielectric washer 48. Diode 42 is fastened within mount 43 by means well known in the art so that it is in electrical current conducting relation with terminal 49. Thus, tunable capacitor diode 42 has one conductive lead 41 fixed to tube 36 and thus to terminal 17 and a second conductive lead fixed to terminal 49. It is seen that varactor diode 42 and its lead 49 are insulated from the resonant cavity parts so as to ensure isolation for direct currents and an effective short for high frequency currents at the floating end of varactor diode 42.

In operation, a frequency controlling voltage source (not shown) is connected between varactor diode lead 49 and terminal 17. Such may be accomplished and voltage adjustment made without interference with the operation of the bias circuit supplied for active diode 10 via terminals 16 and 17. Furthermore, since junction 40 is now at ground potential, the possibility of damage to diodes by burn out is materially reduced.

Conductor 41 acts as a coupling device for the tuning diode 42, coupling diode 42 to the TEM mode field pattern within cavity 5, and forming a transmission line which presents substantially an infinite impedance at junction 40. In essence, coupling conductor 41 behaves as a stub tuner in which the effective stub line length is adjusted electronically.

A particular feature of the inventive apparatus lies in its simplicity of structure, making it universally acceptable for operation in forms designed for use in various parts of the high frequency spectrum. Further, the same simplicity of structure makes the concept particularly useful at very high and microwave frequencies, especially in frequency domains where more complex designs are not acceptable. For example, a resonant mode version of the apparatus for operation at 16 GHz produced an output power of 140 milliwatts with a tuning range of ±60 MHz and with a power output variation of ±0.35 db from the median value over the tuning range. Such performance is made possible even with the very small dimensions required for operation at 16

GHz. The cavity length, for such a converter, from surface 4 to surface 7 is 0.75 inches, while its interior diameter is 0.29 inches. Inner conductor **36*a* and tube 36 are each 0.08 inches in diameter. The separation between conductor 36*a* and tube 36 is 0.025 inches, so that a length of 0.025 inches of the resistor 34 is exposed to the oscillating field in cavity 5. Values larger than 0.025 inches were found experimentally undesirably to reduce the quality factor Q of resonator 5 for the desired oscillation mode. Relatively smaller values permit fringing fields between the respective adjacent faces 50*a* and 50 of rod 36*a* and tube 36** which encourage the growth of undesired oscillation modes, noise, and instability. Anti-resonant mode oscillators according to the invention have also demonstrated similar good qualities. Amplifier operation may be demonstrated by use of a conventional ferrite microwave circulator to separate the input and output signals of the amplifier in the conventional manner.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. A high frequency energy converter comprising:
cavity resonator means having opposed interior surface means closing said cavity resonator means and adapted to conduct high frequency currents,
series high frequency current conducting means conductively connected between said opposed interior surface means comprising:
negative resistance semiconductor diode means, first conductor means,
resistor means having at least one electrical lead means, and
hollow conductor means extending through one of said opposed interior surface means and out of said cavity resonator means for support of said electrical lead means in insulated relation therein,
said negative resistance diode means, said first conductor means, said resistor means, and said electrical lead means providing means for flow of current for biasing said negative resistance diode means, and
transmission line means coupled within said cavity resonator means in high frequency energy exchange relation therewith.

2. Apparatus as described in claim 1 wherein:
said first and hollow conductor means have opposed separated faces forming gap means therebetween for locating said resistor means,
said gap means and said resistor means being located relative to the oscillating electric field of a desired cavity mode so as to form a resistive current path for high frequency currents only of undesired modes between said faces.

3. Apparatus as described in claim 2 wherein said gap means and said resistor means are located in a region of maximum oscillating radial electric field for a desired mode of oscillation within said cavity resonator means.

4. Apparatus as described in claim 1 additionally comprising;
variable capacitor means exterior of said cavity resonator means,
means for coupling a control signal to said variable capacitor means, and
means for coupling said variable capacitor means to said hollow conductor means within the interior of said cavity resonator means for forming tuning means for said cavity resonator means,
the current paths for said tuning means and for said bias current flow means being mutually independent.

* * * * *